United States Patent
Rathmell et al.

(10) Patent No.: US 6,777,696 B1
(45) Date of Patent: Aug. 17, 2004

(54) DEFLECTING ACCELERATION/DECELERATION GAP

(75) Inventors: Robert D. Rathmell, Murphy, TX (US); Bo H. Vanderberg, Boston, MA (US); Yongzhang Huang, Hamilton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 10/370,952

(22) Filed: Feb. 21, 2003

(51) Int. Cl.⁷ .............................................. H01J 37/317
(52) U.S. Cl. ............................. 250/492.21; 250/492.2; 250/492.3
(58) Field of Search ...................... 250/492.21, 492.2, 250/492.3, 281, 297, 298

(56) References Cited

U.S. PATENT DOCUMENTS

| | | | | |
|---|---|---|---|---|
| 5,693,939 A | * | 12/1997 | Purser | 250/251 |
| 5,780,863 A | * | 7/1998 | Benveniste et al. | 250/492.21 |
| 5,969,366 A | | 10/1999 | England et al. | |
| 6,060,715 A | * | 5/2000 | England et al. | 250/492.21 |
| 6,326,631 B1 | | 12/2001 | Politiek et al. | |
| 6,441,382 B1 | | 8/2002 | Huang | |
| 6,489,622 B1 | | 12/2002 | Chen et al. | |
| 6,559,454 B1 | * | 5/2003 | Murrell et al. | 250/423 R |
| 2003/0066976 A1 | | 4/2003 | Chen et al. | |
| 2003/0173914 A1 | | 9/2003 | Yamashita | |

FOREIGN PATENT DOCUMENTS

JP 11329316 11/1999

OTHER PUBLICATIONS

"Conceptual Design of An Energy Contamination Free Decel", Yongzhang Huang, 4 pages, no date available.

* cited by examiner

Primary Examiner—Nikita Wells
Assistant Examiner—Anthony Quash
(74) Attorney, Agent, or Firm—Eschweiler & Associates LLC

(57) ABSTRACT

An accelerating structure and related method for accelerating/decelerating ions of an ion beam are disclosed. The structure and related method are suitable for use in selectively implanting ions into a workpiece or wafer during semiconductor fabrication to selectively dope areas of the wafer. In addition to accelerating and/or decelerating ions, aspects of the present invention serve to focus as well as to deflect ions of an ion beam. This is accomplished by routing the ion beam through electrodes having potentials developed thereacross. The ion beam is also decontaminated as electrically neutral contaminants within the beam are not affected by the potentials and continue on generally traveling along an original path of the ion beam. The electrodes are also arranged in such a fashion so as to minimize the distance the beam has to travel, thereby mitigating the opportunity for beam blow up.

12 Claims, 9 Drawing Sheets

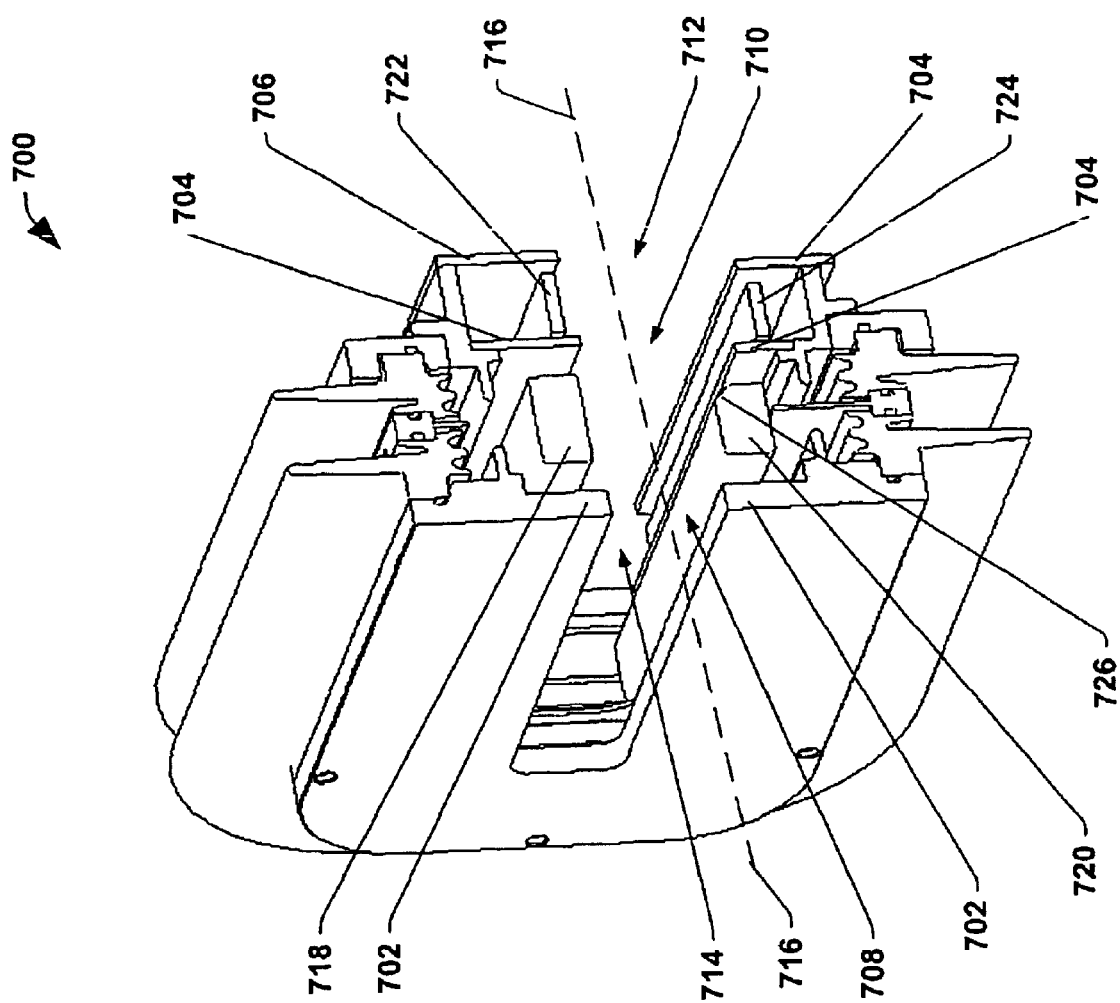

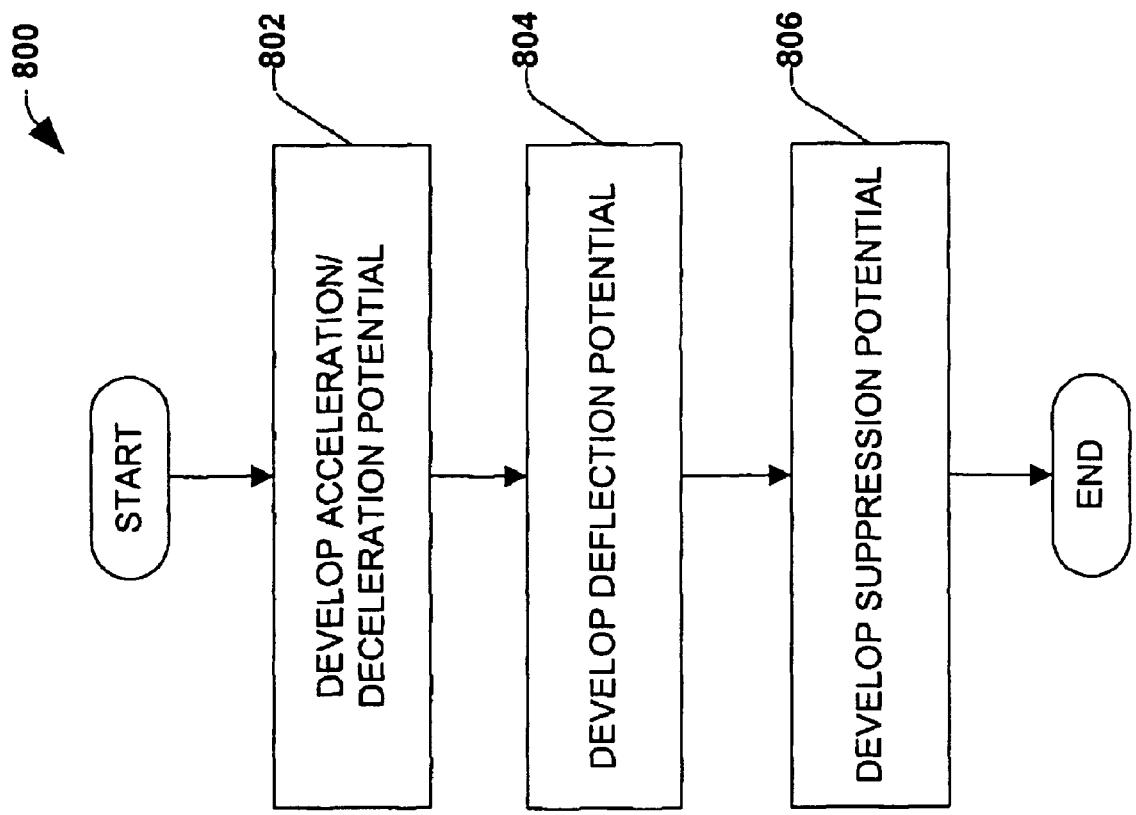

DEFLECTING ACCELERATION/ DECELERATION GAP

FIELD OF THE INVENTION

The present invention relates generally to ion implantation systems, and more particularly to an acceleration gap suitable for use in ion implantation systems.

BACKGROUND OF THE INVENTION

Ion implantation systems are used to dope semiconductors with impurities in integrated circuit manufacturing. In such systems, an ion source ionizes a desired dopant element, which is extracted from the source in the form of an ion beam of desired energy. The ion beam is then directed at the surface of a semiconductor wafer in order to implant the wafer with the dopant element. The ions of the beam penetrate the surface of the wafer to form a region of desired conductivity, such as in the fabrication of transistor devices in the wafer. A typical ion implanter includes an ion source for generating the ion beam, a beamline assembly including a mass analysis apparatus for mass resolving the ion beam using magnetic fields, and a target chamber containing the semiconductor wafer or workpiece to be implanted by the ion beam.

In order to achieve a desired implantation for a given application, the dosage and energy of the implanted ions may be varied. The ion dosage controls the concentration of implanted ions for a given semiconductor material. Typically, high current implanters are used for high dose implants, while medium current implanters are used for lower dosage applications. The ion energy is used to control junction depth in semiconductor devices, where the energy levels of the beam ions determine the degree to which ions are implanted or the depth of the implanted ions. The continuing trend toward smaller and smaller semiconductor devices requires a mechanism which serves to deliver high beam currents at low energies. The high beam current provides the necessary dosage levels, while the low energy permits shallow implants.

In addition, the continuing trend toward higher device densities on a semiconductor wafer requires careful control over the uniformity of implantation beams being scanned across the workpiece. Another continuing trend is toward larger and larger semiconductor wafer sizes, such as 300 mm diameter wafers. Coupled with higher device densities, the larger wafer size increases the cost of individual wafers. As a result, control over implantation uniformity and other parameters is more critical than ever in avoiding or mitigating expenses associated with scrapping wafers.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention is directed to an accelerator or accelerating structure and related methodology for accelerating/decelerating ions of an ion beam. The accelerator and related methodology are suitable for use in selectively implanting ions into a workpiece or wafer during semiconductor fabrication to selectively dope areas of the wafer. In addition to accelerating and/or decelerating ions, aspects of the present invention serve to focus as well as to deflect ions of an ion beam. This is accomplished by routing the ion beam through electrodes having potentials developed thereacross. The ion beam is also decontaminated as electrically neutral contaminants within the beam are not affected by the potentials and continue to travel generally along an original path of the ion beam. The electrodes are also arranged in such a fashion so as to minimize the distance the beam has to travel through the accelerator, thereby mitigating the propensity for beam blow up.

According to one aspect of the present invention, an accelerator suitable for use in implanting ions into a workpiece includes a first electrode having a first aperture formed therein and a second electrode having a second aperture formed therein. The first and second electrodes are oriented so as to be substantially parallel to one another, and the first and second apertures are aligned such that an axis substantially normal to the first and second electrodes passes through a gap defined between the first and second apertures and through coincident points in the first and second apertures. A potential developed between the first and second electrodes causes ions of an ion beam generally traveling along the axis to be accelerated or decelerated depending upon biasing of the potential as the ion beam passes into the first aperture and out through the second aperture. The accelerator also includes a first mid-gap electrode located between the first and second electrodes and above the gap, as well as a second mid-gap electrode located between the first and second electrodes and below the gap. A potential developed between the first and second mid-gap electrodes causes the ions within the ion beam to deflect away from the axis.

According to another aspect of the present invention, an accelerator suitable for use in implanting ions into a workpiece includes means for accelerating/decelerating ions of an ion beam and means for bending the ion beam by deflecting ions within the ion beam away from an axis along which the ion beam generally travels. The means for accelerating/decelerating and the means for bending operate independently of one another to accelerate/decelerate and bend the beam, respectively.

According to yet another aspect of the present invention, a method for accelerating/decelerating ions suitable for implanting ions into a workpiece includes developing a potential between a first pair of electrodes to accelerate/decelerate ions of an ion beam and developing a potential between a second pair of electrodes to deflect ions of the ion beam.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

FIG. 7 is a perspective cross sectional view of an example of an accelerator according to one or more aspects of the present invention; and FIG. 8 is a flow diagram illustrating a method for accelerating/decelerating ions of an ion beam in accordance with one or more aspects of the present invention.

DETAILED DESCRIPTION OF THE INVENTION

Figure 1:
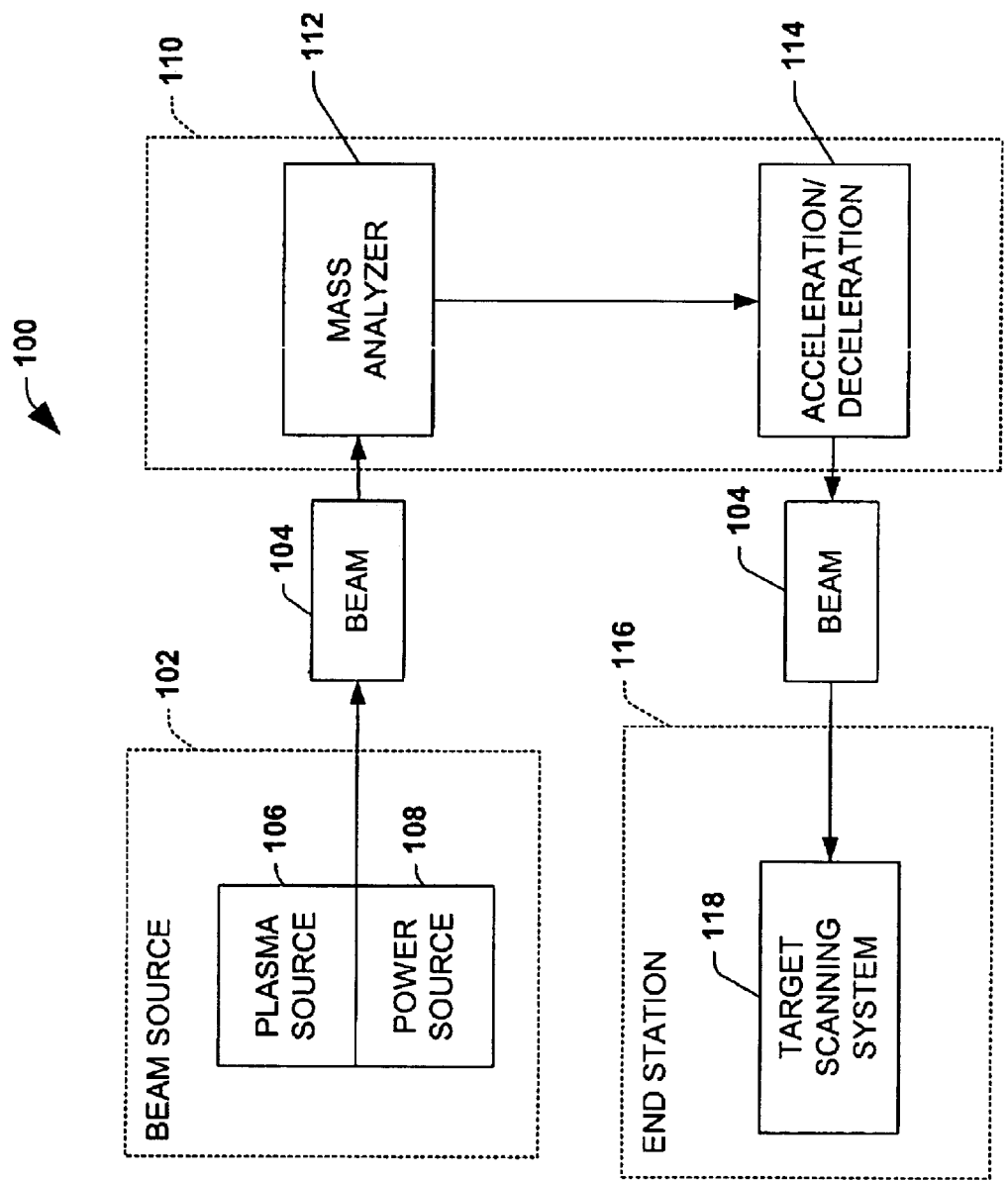
FIG. 1 is a schematic block diagram illustrating components of an ion implantation system in accordance with one or more aspects of the present invention.

The present invention will now be described with reference to the drawings wherein like reference numerals are used to refer to like elements throughout. The illustrations and following descriptions are exemplary in nature, and not limiting. Thus, it will be appreciated that variants of the illustrated systems and methods and other such implementations apart from those illustrated herein are deemed as falling within the scope of the present invention and the appended claims.

The present invention pertains to an accelerator and related method for accelerating/decelerating ions of an ion beam. The accelerator and related method are suitable for use in selectively implanting ions into a workpiece or wafer during semiconductor fabrication to selectively dope areas of the wafer. In addition to accelerating and/or decelerating ions, aspects of the present invention serve to focus as well as to deflect ions of an ion beam. This is accomplished by routing the ions of the beam through electrodes having potentials developed thereacross. The ion beam is also decontaminated as electrically neutral contaminants within the beam are not affected by the potentials and continue to travel generally along an original path of the ion beam. The electrodes are also arranged in such a fashion so as to minimize the distance the beam has to travel, thereby mitigating the opportunity for beam blow up.

Referring initially to FIG. 1, an ion implantation system 100 suitable for implementing one or more aspects of the present invention is depicted in block diagram form. The system 100 includes an ion source 102 for producing an ion beam 104 along a beam path. The ion beam source 102 includes, for example, a plasma source 106 with an associated power source 108. The plasma source 106 may, for example, comprise a relatively long plasma confinement chamber from which an ion beam is extracted.

A beamline assembly 110 is provided downstream of the ion source 102 to receive the beam 104 therefrom. The beamline assembly 110 includes a mass analyzer 112 as well as an acceleration structure 114, which may include, for example, one or more gaps according to one or more aspects of the present invention. The beamline assembly 110 is situated along the path to receive the beam 104. The mass analyzer 112 includes a field generating component, such as a magnet (not shown), and operates to provide a field across the beam path so as to deflect ions from the ion beam 104 at varying trajectories according to mass (e.g., charge to mass ratio). Ions traveling through the magnetic field experience a force which directs individual ions of a desired mass along the beam path and which deflects ions of undesired mass away from the beam path.

The acceleration gap or gaps 114 are operable to accelerate and/or decelerate ions within the beam to achieve a desired depth of implantation in a workpiece, as well as to decontaminate the beam by bending the beam and separating out contaminating neutral particles from the beam in manners discussed in greater detail below. Further, the acceleration gap 114 may also be operable to focus the beam. Accordingly, it will be appreciated that while the terms accelerator and/or acceleration gap may be utilized herein in describing one or more aspects of the present invention, such terms are not intended to be construed narrowly so as to be limited to a literal interpretation of acceleration, but are to be construed broadly so as to include, among other things, deceleration as well as changes in direction. It will be further appreciated that acceleration/deceleration means 114 may be applied before as well as after the magnetic analysis by the mass analyzer 112.

An end station 116 is also provided in the system 100 to receive the mass analyzed decontaminated ion beam 104 from the beamline assembly 110. The end station 116 supports one or more workpieces such as semiconductor wafers (not shown) along the beam path for implantation using the mass analyzed decontaminated ion beam 104. The end station 116 includes a target scanning system 118 for translating or scanning one or more target workpieces and the ion beam 104 relative to one another. The target scanning system 118 may provide for batch or serial implantation, for example, as may be desired under given circumstances, operating parameters and/or objectives.

Figure 2A:
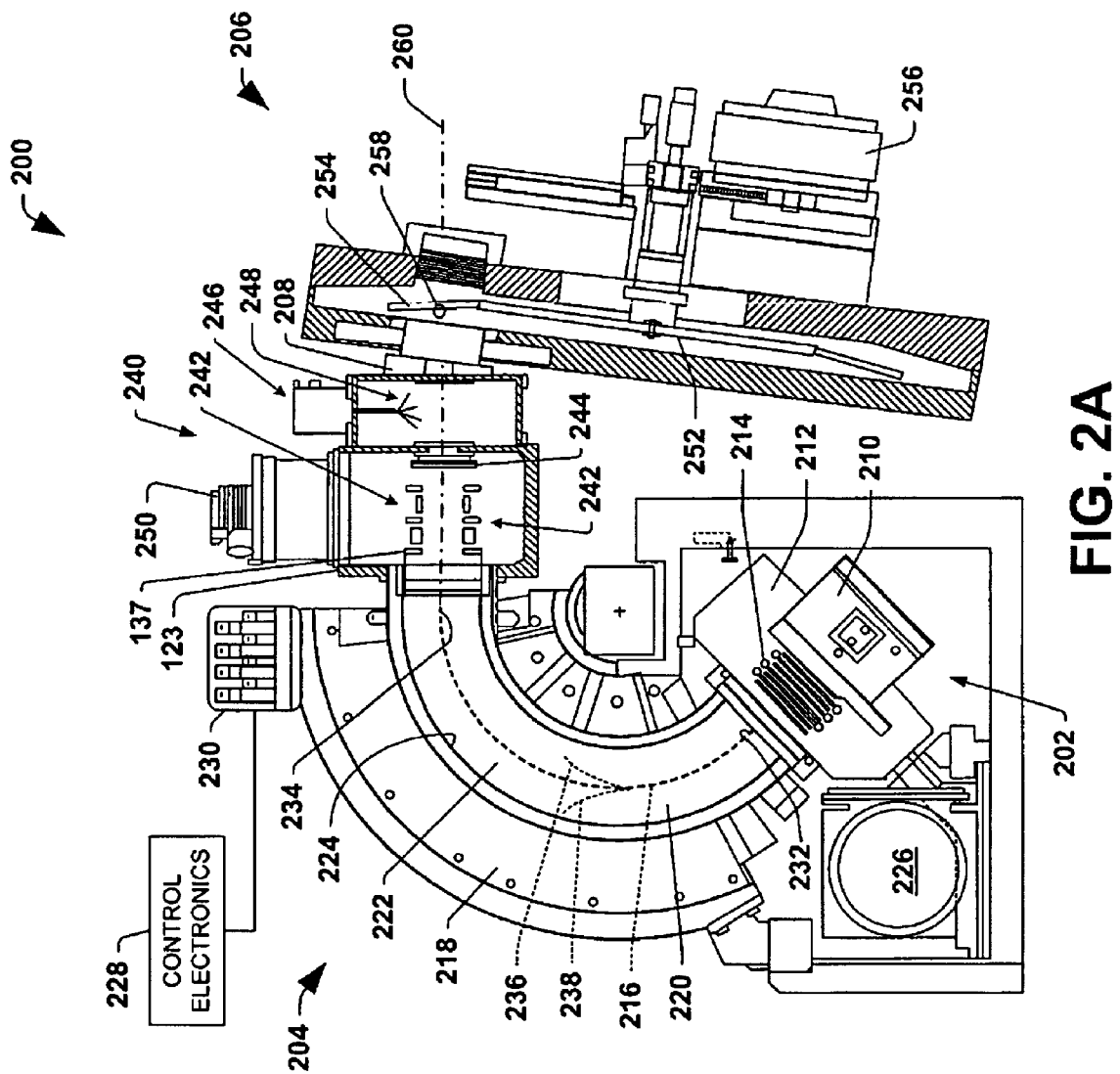
FIG. 2A is a cross sectional side view illustrating an ion implantation system in accordance with one or more aspects of the present invention.

Referring now to FIG. 2A, an exemplary ion implantation system 200 suitable for implementing one or more aspects of the present invention is depicted in somewhat greater detail. The system 200 includes an ion source 202, a beamline assembly 204, and a target or end station 206. An expansible stainless steel bellows assembly 208, which permits movement of the end station 206 with respect to the beamline assembly 204, connects the end station 206 and the beamline assembly 204.

The ion source 202 comprises a plasma chamber 210 and an ion extractor assembly 212. Energy is imparted to an ionizable dopant gas to generate ions within the plasma chamber 210. Generally, positive ions are generated, although the present invention is applicable to systems wherein negative ions are generated by the source 202. The positive ions are extracted through a slit in the plasma chamber 210 by the ion extractor assembly 212, which comprises a plurality of electrodes 214. Accordingly, the ion extractor assembly 212 functions to extract a beam 216 of positive ions from the plasma chamber 210 and to accelerate the extracted ions into the beamline assembly 204, and more particularly into a mass analysis magnet 218 within the beamline assembly 204.

The mass analysis magnet 218 includes a curved beam path 220 within a passageway 222 defined by a metal (e.g., aluminum) beam guide having side walls 224, evacuation of which is provided by a vacuum pump 226. The ion beam 216 that propagates along this path 220 is affected by the magnetic field generated by the mass analysis magnet 218, to reject ions of an inappropriate charge-to-mass ratio. The strength and orientation of this dipole magnetic field is controlled by control electronics 228 which adjust the electrical current through the field windings of the magnet 218 through a magnet connector 230.

The dipole magnetic field causes the ion beam 216 to move along the curved beam path 220 from a first or entrance trajectory 232 near the ion source 202 to a second or exit trajectory 234 near an exiting end of the passageway 222. Portions 236 and 238 of the beam 216, comprised of ions having an inappropriate charge-to-mass ratio, are deflected away from the curved trajectory and into the beam guide side walls 224. In this manner, the magnet 218 only allows those ions in the beam 220 which have the desired charge-to-mass ratio to traverse entirely through the passageway 222.

The beamline assembly 204 can also be said to include an accelerator 240 according to one or more aspects of the present invention. The accelerator 240 includes a plurality of electrodes 242 arranged and biased to accelerate and/or decelerate ions, as well as to focus, bend and decontaminate the ion beam as in manner(s) discussed in greater detail below. A dosimetry indicator such as a Faraday flag 244 may also be included to detect a sample current of the ion beam. A source of plasma 246 may also be included to provide a plasma shower 248 for neutralizing a (positive) charge that would otherwise accumulate on a target workpiece as a result of being implanted by the (positively) charged ion beam 216. A vacuum pump 250 may further be included to evacuate the accelerator 240.

Downstream of the accelerator 240 is the end station 206, which includes a support 252 upon which one or more wafers 254 or other workpieces to be treated are mounted. The wafer support 252 resides in a target plane which is generally perpendicularly oriented to the direction of the implant beam, although the wafer support may also be oriented at angles substantially different from that shown and described. Wafer support may also, for example, take the form of a mechanical arm capable of moving a wafer through the beam or a rotating disk. FIG. 2A illustrates a disc shaped wafer support 252 which is rotated by a motor 256 at the end station 206. The ion beam thus strikes wafers mounted to the support as they move in a circular path. The end station 206 pivots about point 258, which is the intersection of the path 260 of the ion beam and the wafer 254, so that the target plane is adjustable about this point 258.

It will be appreciated that the neutral contaminating particles may be produced in a region upstream of the accelerator by collisions among ions and background or residual particles. Such encounters can cause some of the ions to exchange charges with the background or other particles thereby becoming neutral particles or contaminants. These neutral particles can be implanted onto the wafer in areas that are to be doped with ions, thereby diluting the intended level of doping and adversely affecting the doping process. More importantly, because these particles are electrically neutral they can pass through the accelerator, and more particularly through electrostatic fields generated by the electrodes unaffected (e.g., without being accelerated, decelerated, focused, bent or otherwise altered in speed and/or direction). As such, these particles can be implanted into the wafer at undesired depths as their (unaffected) energy levels will likely differ from the energy levels of the bent, focused, accelerated and/or decelerated ions in the ion beam that have passed through and been adjusted by the accelerator. This neutral particle contamination can severely degrade the desired performance of resulting semiconductor devices.

One or more aspects of the present invention address neutral particle contamination, at least, by bending the beam of ions with one or more of the electrodes 242 of the accelerator to deflect the ions away from the neutral contaminants within the beam. The decontaminated beam of ions may, for example, be deflected by an angle of between about 5 to 25 degrees from the path of the contaminants, which also happens to be the original path of the (contaminated) ion beam as the contaminants are unaffected by the electrodes since the contaminants are electrically neutral. The beam of ions is directed onto the workpiece to encounter select areas of the workpiece to be doped. It will be appreciated that some type of barrier can, for example, be placed in front of the stream of neutral particles to prevent the contaminants from encountering the workpiece or wafer.

It will be further appreciated that one or more aspects of the present invention also address issues related to ion beam blow up. Beam blow up occurs as a result of the repulsive properties of like charged particles. Positively charged ions which form the ion beam repulse each other because of a so-called "space-charge force". Space-charge effects are inversely proportional to the square of the ion beam energy, and thus may increase as the ions in the beam are decelerated, making the beam more prone to dispersal or blow up. Because of the space-charge force, the lateral spread of an ion beam is proportional to:

$$(\sqrt{m}/\sqrt{q}) \times (Iz^2/U^{3/2})$$

where m is an ion mass, q is an ion charge, I is a beam current, U is beam energy, and z is the traveling distance of the ion beam, assuming that the ion beam is uniform and has a circular cross section. Thus, it can be appreciated that the likelihood of beam blow up increases as the distance that the beam travels increases. Accordingly, if an ion beam travels over a long distance to a wafer, it becomes more difficult for all ions to reach the wafer, particularly where the beam is decelerated and there is a large beam current or concentration of ions within the beam. One or more aspects of the present invention address beam blow up, at least, by arranging the electrodes within the accelerator so as to minimize the distance that the beam has to travel to reach the target wafer as well as by focusing the beam to oppose space charge induced beam dispersion.

Figure 2B:
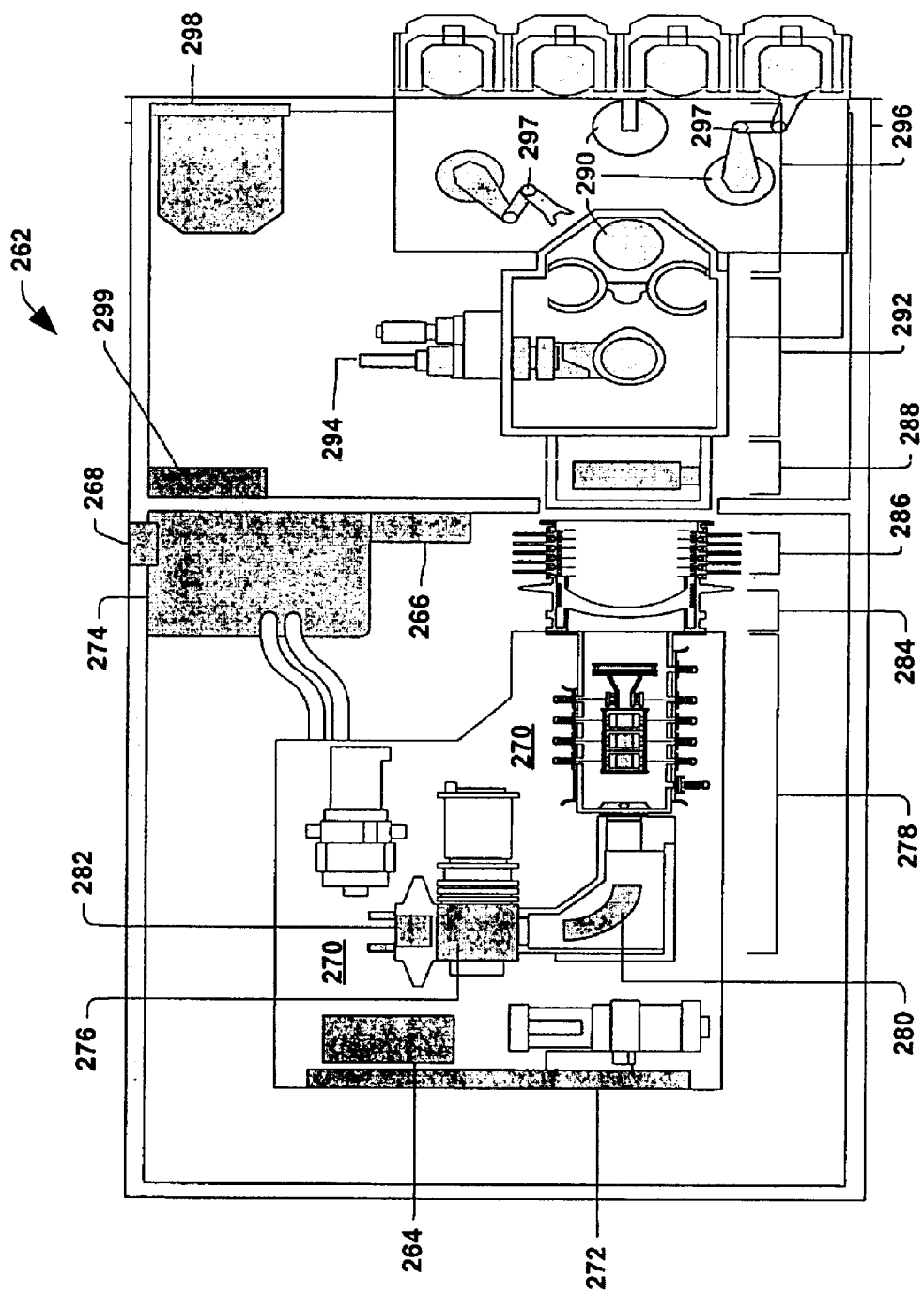
FIG. 2B is a schematic view of an ion implantation system in accordance with one or more aspects of the present invention.

FIG. 2B illustrates yet another ion implantation system 262 suitable for implementing one or more aspects of the present invention. The system 262 includes a modular gas box 264, an auxiliary gas box 266 and a gas box remote purge control panel 268. The gas boxes 264, 268 comprise, among other things, one or more gases of a dopant substance, and the boxes 264, 268 facilitate selective delivery of the gas(es) into an extended life ion source 282 within the system 262, wherein the gas(es) can be ionized to generate ions suitable for implantation into wafers or workpieces selectively brought into the system 262. The gas box remote control panel 268 facilitates venting or purging gas(es) or other substances out of the system 262 on an as needed or desired basis.

High voltage terminal power distribution 272 and a high voltage isolation transformer 274 are included to, among other things, electrically excite and impart energy to the dopant gas(es) to generate ions from the gas(es). An ion beam extraction assembly 276 is included to extract ions from the ion source 282 and accelerate them into a beamline 278, which includes a mass analysis magnet 280. The mass analysis magnet 280 is operable to sort out or reject ions of an inappropriate charge-to-mass ratio. In particular, the mass analysis magnet 280 comprises a beamguide having curved sidewalls into which ions of an undesired mass-to-charge ratio collide as they are propagated through the beamguide by way of one or more magnetic fields generated by magnet(s) of the mass analysis magnet 280.

According to one or more aspects of the present invention, a component 284 may be included to assist with controlling the angle of the scanned ion beam. This may include, among other things, a scan angle correction lens. An acceleration/deceleration column 286 facilitates controlling and adjusting the speed, and/or focusing, of ions within the ion beam. A component 288 operable to filter out contaminant particles, such as a final energy filter is also included in accordance with one or more aspects of the present invention to mitigate energy contaminating particles from encountering wafers or workpieces. The present example of the invention combines the effects of 286 and 288 into one structure.

Wafers or workpieces 290 are loaded into an end station chamber 292 for selective implantation with ions. A mechanical scan drive 294 maneuvers the wafers within the chamber 292 to facilitate selective encounters with the beam(s). The wafers or workpieces 290 are moved into the end station chamber 292 by a wafer handling system 296, which may include, for example, one or more mechanical or robotic arms 297. An operator console 298 allows an operator to regulate the implantation process by selectively controlling one or more components of the system 262. Finally, a power distribution box 299 is included to provide power to the overall system 262.

Ion beam focusing properties of an accelerator 300 provided in accordance with one or more aspects of the present invention are depicted and discussed with reference to FIG. 3. First 302 and second 304 electrodes are provided which have first 306 and second 308 apertures formed therein, respectively. The first 302 and second 304 electrodes are substantially parallel to one another, and the apertures 306, 308 define a gap 310 between the electrodes 302, 304 through which an axis 312 substantially normal to the electrodes 302, 304 may pass so as to intersect the first 306 and second 308 apertures. The gap 310 has a width 314 substantially equal to the distance between the first 302 and second 304 electrodes, and a height 316 substantially equal to that of the first 306 and second 308 apertures. It will be appreciated, however, that the elements, features, components and/or items illustrated in the FIG. 3 (as well as in all of the other figures included herewith) may not be shown to scale nor with correct proportions relative to one another. By way of example, the gap 310 and apertures 306, 308 may be significantly magnified in FIG. 3 relative to their actual size.

In operation, an electrostatic field 318 is generated between the electrodes 302, 304 by applying different biases 320, 322 to the first 302 and second 304 electrodes. The apertures 306, 308 affect the electric field distribution because the internal electric field leaks through the apertures 306, 308. As such, field lines 324 bow out into the gap 310 as the electrostatic field curls around ends 326 of the electrodes 302, 304 which define the apertures 306, 308. It will be appreciated that in the example illustrated in FIG. 3, the electrodes 302, 304 are biased to decelerate ions passing through the gap 310 as the field lines are directed from the second electrode 304 to the first electrode 302 as indicated by the direction of the arrows on the field lines 324.

Figure 3:
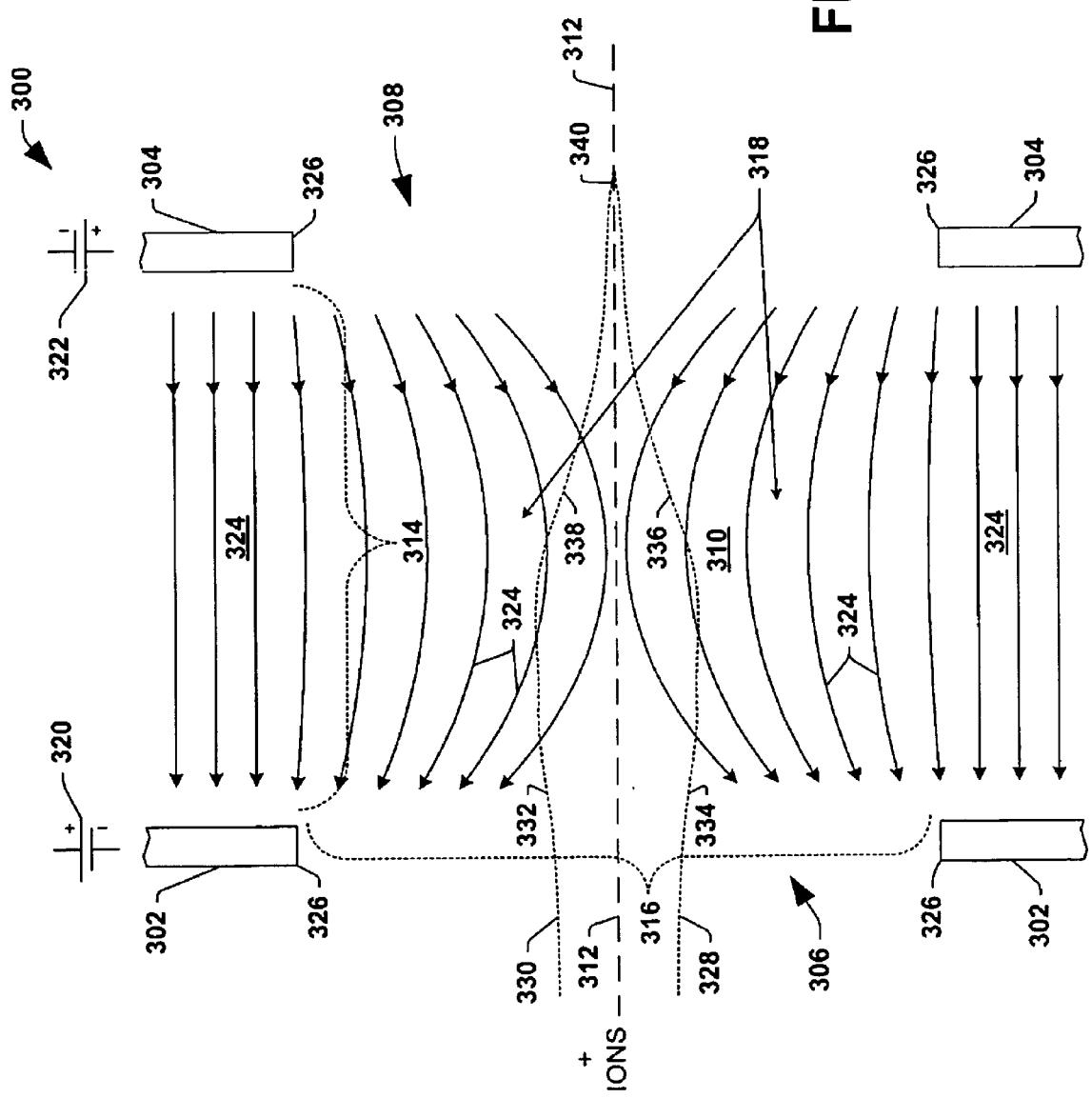
FIG. 3 is an illustration depicting focusing effects of electrodes in a deceleration mode according to one or more aspects of the present invention.

Two trajectories 328, 330 of ions in an ion beam passing though the gap are depicted in FIG. 3 to illustrate focusing effects. It will be appreciated that these trajectories are exemplary in nature and that trajectories of actual ions may differ from these trajectories 328, 330 somewhat. During deceleration, as the ions enter the gap 310 through the first aperture 306, the field lines 324 push the ions away from the axis 312 running through the gap 310. However, when the ions initially enter the gap 310, they still possess a great deal of energy and momentum as they have not been significantly decelerated. The field lines 324 thus have a minimal affect on the trajectories of the ions at this point and the ions are pushed away from the axis 312 only slightly as indicated at 332 and 334. As the ions continue through the gap, however, they are decelerated to a greater and greater degree and the field lines 324 thus have a greater affect on their respective trajectories. When the ions are approximately half way through the gap 310, the field lines 324 push the ions toward the axis 312 running through the gap 310 as indicated at 336 and 338. As the ions approach the second aperture 308, they have been significantly decelerated and have greatly reduced momentums. As a result, the field lines 324 affect their trajectories to a much greater degree causing them to converge towards the axis 310 as indicated at 340. The overall net effect, thus, is convergence or focusing of the ion beam. It will be appreciated that the amount of convergence illustrated in FIG. 3 may be exaggerated for purposes of illustration.

Figure 4:
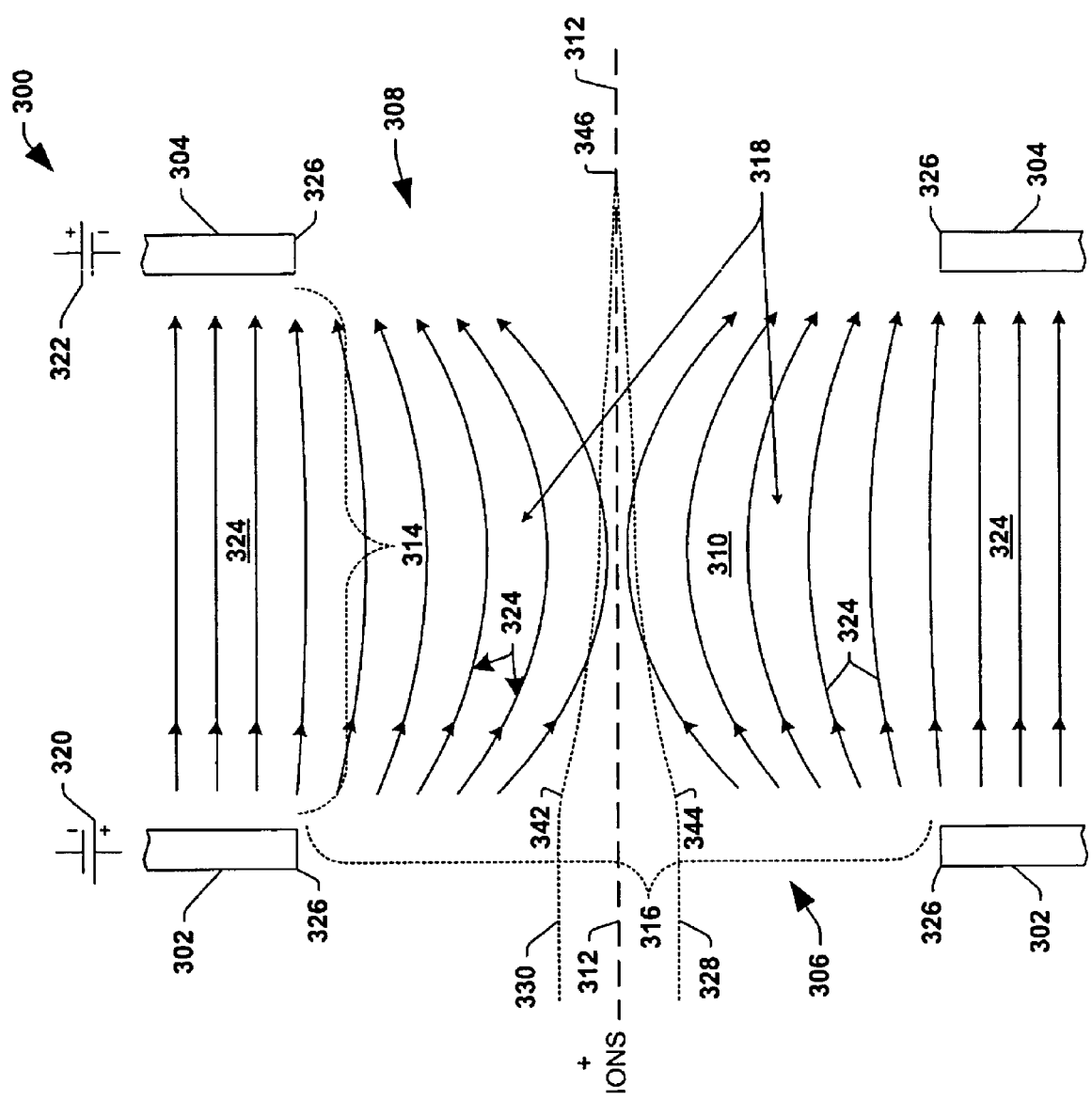
FIG. 4 is an illustration depicting focusing effects of electrodes in an acceleration mode according to one or more aspects of the present invention.

It will be appreciated that this overall net effect of ion beam focusing holds true where the ion beam is accelerated as well. This is illustrated in FIG. 4 where the first 302 and second 304 electrodes are biased such that the field lines 324 point in a direction from the first electrode 302 toward the second electrode 304 to accelerate ions thorough the gap 310. As ions enter the gap 310 through the first aperture 306, they are pushed in toward the axis 312 by the field lines 324 as indicted at 342 and 344. At this point they are pushed in rather significantly as the ions are initially moving rather slowly and have little momentum. As the ions continue to pass through the gap, however, they are continually accelerated and pick up increased momentum. As such, once the ions reach about the halfway point of the gap 310, the field lines have little affect on their trajectories as the ions speed through the gap 310 and out the second aperture 308. The overall net effect is thus once again convergence of the ion beam as indicated at 346, which may likewise be exaggerated for purposes of illustration.

Figure 5:
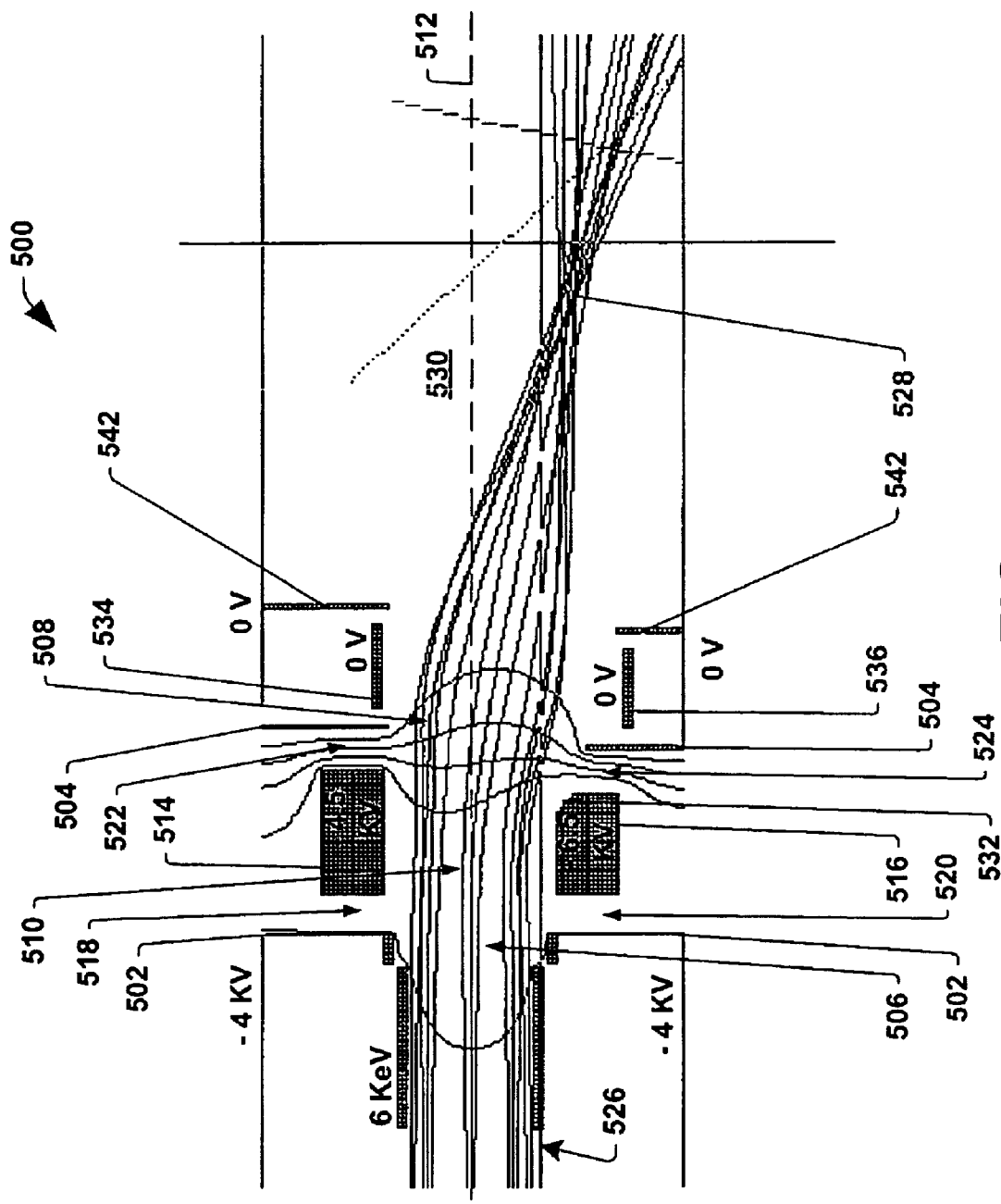
FIG. 5 is an illustration depicting bending effects of electrodes in a deceleration mode according to one or more aspects of the present invention.

Turning now to FIG. 5, an accelerator 500 in accordance with one or more aspects of the present invention is illustrated in greater detail. The accelerator 500 includes first 502 and second 504 electrodes and a pair of intermediate electrode plates. The first 502 and second 504 electrodes are substantially parallel to one another and contain first 506 and second 508 apertures, respectively. A gap 510 is defined between the apertures 506, 508 and the electrodes 502, 504 are arranged such that an axis 512 substantially normal to the first 502 and second 504 electrodes runs through the gap 510 and through the first 506 and second 508 apertures.

The intermediate electrode plates comprise an upper mid-gap electrode 514 and a lower mid-gap electrode 516. A first upper sub-gap area 518 is defined between the first electrode 502 and the upper mid-gap electrode 514. A first lower sub-gap area 520 is defined between the first electrode 502 and the lower mid-gap electrode 516. Similarly, a second upper sub-gap area 522 is defined between the second electrode 504 and the upper mid-gap electrode 514, and a second lower sub-gap area 524 is defined between the second electrode 504 and the lower mid-gap electrode 516. An ion beam 526 passes through the gap 510 and is deflected from the axis 512, such as by about 12 degrees, for example, and is focused at a point 528 downstream from the gap 510.

In the illustrated example, particular biases are depicted to facilitate a discussion of the operation of the accelerator 500.

It will be appreciated, however, that, for purposes of the present invention, any suitable biases may be applied among the electrodes to achieve desired results (e.g., degree of acceleration, deceleration, and/or deflection). The bias values in FIG. 5 are, however, effective to demonstrate deceleration of the ion beam 526.

The ion beam 526 and more particularly the ions comprised therein, enter the gap 510 through the first aperture 506 with an initial energy level (e.g., 6 KeV in the example illustrated). To accelerate or decelerate the ions in the beam, the first 502 and second 504 electrodes are biased differently so that a difference in potential exists therebetween and the ions experience a corresponding increase or decrease in energy as they pass through the gap 510 between the first 502 and second 504 electrodes. For instance, in the example presented in FIG. 5, the ions experience an energy drop of 4 KeV as they pass from the first electrode 502 which has a negative 4 KV bias to the second electrode 504 which has zero potential (e.g., is coupled to ground). The original energy of 6 KeV is thus reduced to 2 KeV as the ions pass through the gap 510 and experience a 4 KeV energy drop. The ion beam 526 will therefore have a particular resulting energy level (e.g., 2 KeV in the example illustrated) once it exits the gap 510 and enters a neutral zone 530 downstream from the gap 510.

It will be appreciated that this is true regardless of the path the ions may have taken to get through the gap 510. For instance, in the example illustrated, ions entering the lower sub-gap 520 between the first electrode 502 and the lower mid-gap electrode 516 will be accelerated at a rate greater than the rate at which ions entering the upper sub-gap 518 between the first electrode 502 and the upper mid-gap electrode 514 will be accelerated. This is because there is a greater difference in potential between the first electrode 502 and the lower mid-gap electrode 516 than there is between the first electrode 502 and the upper mid-gap electrode 514 (i.e., negative 2.5 KV for the lower sub-gap 520 (negative 4 KV minus negative 6.5 KV) and negative 0.5 KV for the upper sub-gap 518 (negative 4 KV minus negative 4.5 KV)).

This difference in acceleration is, however, offset by a corresponding difference in potential between the upper 514 and lower 516 mid-gap electrodes and the second electrode 504. For instance, in the example illustrated, the second electrode 504 is biased to zero (e.g., coupled to ground). Thus, the ions coming from the first lower sub-gap 520 are decelerated to a greater degree than the ions coming from the first upper sub-gap 518. This offsets the differences in acceleration of the ions as they enter the gap such that as the ions exit the gap they all possess substantially the same energy (e.g., 2 KeV). The ions coming form the first lower sub-gap 520 will be decelerated to a greater degree because they will have to traverse the negative 6.5 KV while crossing the second lower sub-gap 524 (e.g., the negative 6.5 KV bias of the lower mid-gap electrode 516 minus the zero V bias of the second electrode 504). In contrast, the ions coming from the first upper sub-gap 518 will be decelerated to a lesser degree because they will merely have to traverse the negative 4.5 KV while crossing the second upper sub-gap 522 (e.g., the negative 4.5 KV bias of the upper mid-gap electrode 614 minus the zero V bias of the second electrode 504). Accordingly, regardless of the different paths they take and the energy levels they fall through, the ions emerge from the effects of the gap at substantially the same energy level (e.g., 2 KeV).

It will be appreciated that the upper 514 and lower 516 mid-gap electrodes serve at least two purposes; beam bending and to pull the beam into the gap 510 to mitigate beam blow up. The mid-gap plates 514, 516 are generally biased differently from one another so that an electrostatic field is developed therebetween to bend the beam either up or down, depending upon the biasing. In the example featured, for instance, the upper 514 and lower 516 mid-gap electrodes are biased to negative 4.5 KV and negative 6.5 KV, respectively. Presuming the beam comprises positively charged ions, this difference in potential causes the positively charged ions passing through the gap 510 to be forced downward toward the more negatively charged lower mid-gap electrode 516, ultimately causing the beam 526 to bend or deflect downward (e.g., by about 12 degrees).

The difference in potential between the upper 514 and lower 516 mid-gap electrodes and the first 502 and second 504 electrodes mitigate beam blow up by affecting how the ions in the beam 526 enter the gap 510. This may be necessary because the entering beam may be at or near a maximum beam current (e.g., concentration of ions) and may thus may have a great propensity to disperse radially outwardly or blow up, particularly upon entering the electrostatic field wherein the space charge will increase. For instance, in the example illustrated in FIG. 5 the upper 514 and lower 516 mid-gap electrodes are biased negatively relative to the voltage of the first electrode 502 (e.g., negative 4.5 KV and negative 6.5 KV relative to negative 4 KV, respectively). This difference in potential pulls the ions in the beam 526 into the gap 510. As such, the beam 526 is accelerated into the first upper and lower sub-gaps 518, 520 and beam blow up is thereby mitigated. This, coupled with the beam focusing effects (FIGS. 3 and 4), facilitates passing the beam 510 through the gap 510 within the accelerator structure 500 without losing containment of the beam 526.

It will be appreciated that the arrangement, configuration and/or shaping of the upper 514 and lower 516 mid-gap electrodes can be tailored to facilitate control over the lensing effect of the beam. By way of example, in the illustration depicted in FIG. 5, the lower mid-gap electrode 516 has a slightly reduced width relative to that of the upper mid-gap electrode 514 and also possesses a slightly beveled corner 532. These adjustments essentially counter the increased lensing effects that the ions near the lower mid-gap electrode 516 experience as they undergo stronger acceleration and/or deceleration due to differences in applied biases. It will be appreciated, however, that for purposes of the present invention these electrodes 514, 516 can have any suitable configurations, including identical shapings. It will be further appreciated that the beam can be bent in acceleration, deceleration and/or drift (e.g., zero accel/decel) modes because the upper and lower mid-gap electrodes 514, 516, which are predominately responsible for beam bending, operate substantially independently of the first and second electrodes 502, 504, which are predominantly responsible for the acceleration/deceleration of the beam 510.

The overall net affect of all of the differences in potential is both focusing and deflecting of ions in the beam 526. Decontamination of the beam occurs as neutral particles in the beam, which are undeterred by the effects of the electrodes, continue along the original beam path parallel to the axis 512. The contaminants may then, for example, encounter some type of barrier or absorbing structure (not shown) which halts their forward progress and shields any workpiece from the contaminants. In contrast, the trajectory of the deflected ion beam 526 causes it to appropriately encounter and dope select areas of the workpiece (not shown). It will be appreciated that the arrangement of the electrodes (e.g., the upper and lower mid-gap electrodes 514, 516 intermediate the first and second electrodes 502, 504) also serves to mitigate beam blow up as this configuration minimizes the distance the beam 526 has to travel before encountering the wafer. By having the beam 526 be deflected (e.g., by the upper and lower mid-gap electrodes 514, 516) while concurrently having the beam be focused (e.g., by the first and second electrodes 502, 504), rather than having these bending and focusing stages arranged serially, the end station can be situated closer to the accelerator.

Figure 6:
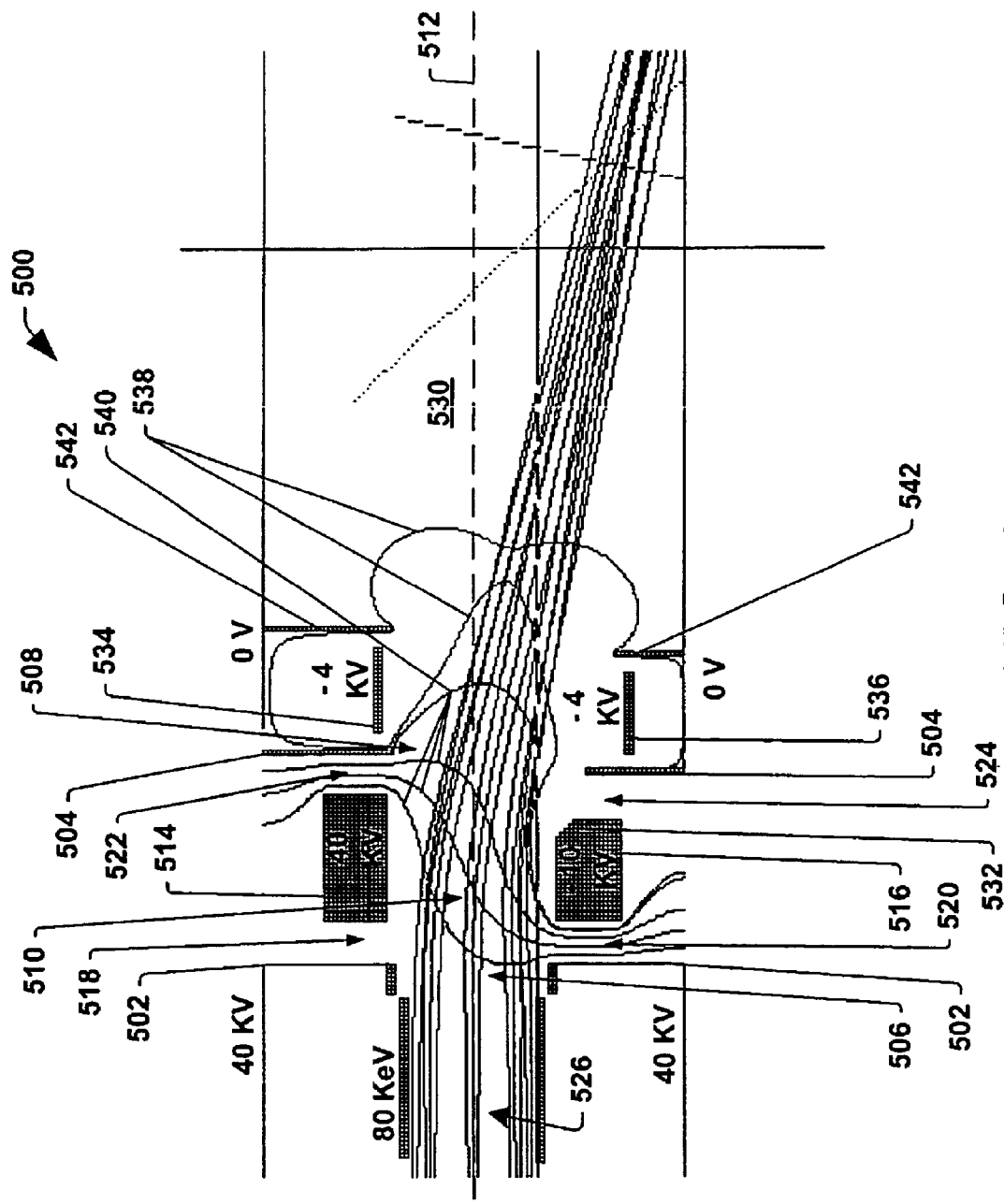
FIG. 6 is an illustration depicting bending effects of electrodes in an acceleration mode according to one or more aspects of the present invention.

According to one or more other aspects of the present invention, the accelerator 500 can also include upper and lower suppression electrodes 534, 536. The suppression electrodes serve to create a potential barrier between the wafer and potentials upstream of the neutral zone 530. Turning to FIG. 6, for example, which depicts acceleration of an ion beam, the suppression electrodes 534, 536 are each biased to negative 4 KV, although any biasing value(s) are contemplated by the present invention. The biasing arrangement creates a negative potential barrier 538 which extends out into the neutral zone 530. In the absence of such suppression electrodes 534, 536 and the developed barrier 538, positive potentials 540 from the other electrodes may penetrate out into the neutral zone, which is adjacent to the end station (not shown), and pull electrons out of the beam 526 as well as those that may exist on or near the wafer. This can interfere with space charge control which is effected by a plasma flood which feeds electrons into the beam near the end station, and whose purpose it is to neutralize or reduce charging of the wafer that would otherwise occur as a result of the implantation of positively charged ions into the wafer. Positive potentials 540 upstream of the end station may attract the plasma neutralizing electrons away from the wafer, resulting in potential beam blow up and charging up of the wafer. The negative barrier or wall 538 created by the suppression electrodes 534, 536 will turn electrons around that would otherwise be pulled away from the end station by the potentials 540.

A third electrode 542 is also included in the device 500 in accordance with another aspect of the present invention. In the example illustrated is both FIGS. 5 and 6, the third electrode has zero potential (e.g., is coupled to ground). The potential on this electrode is effective to terminate the field 538 from the suppression electrodes 534, 536. It will be appreciated that while the suppression electrodes are substantially equidistant from either side of the (bent) beam 526 so as to create a substantially symmetrical barrier configuration, any arrangement is contemplated by the present invention.

Additionally, while FIG. 6, has been referenced in describing the suppression electrodes 534, 536, it will be appreciated that the operation of the device is substantially similar to the that described with reference to FIG. 5, but that the beam 526 is accelerated rather than decelerated and that the focal point of the beam 526 is off of the page. The exemplary values depicted in FIG. 6 serve to increase the energy level of the beam from 80 KeV to 120 KeV, accelerating the beam by factor of 1.5. Positive ions in the beam 526 will be accelerated as the ions traverse the second upper sub-gap area 522 and the second lower sub-gap area 524.

Turning to FIG. 7, a perspective cross sectional view of an exemplary accelerator 700 according to one or more aspects of the present invention is illustrated. The accelerator includes first, second and third electrodes 702, 704, 706 substantially parallel to one another. Each of the electrodes 702, 704, 706 has respective apertures 708, 710, 712 formed therein. The apertures 708, 710, 712 define a gap 714 running through the device 700, such that an axis 716 drawn through the gap 714 intersects coincident points in the apertures 708, 710, 712. Upper and lower mid-gap electrodes 718, 720 are juxtaposed between the first and second electrodes 702, 704 above and below the gap 714, respectively. Similarly, upper and lower suppression electrodes 722, 724 are juxtaposed between the second and third electrodes 704, 706 above and below the gap 714, respectively. In the example shown, the lower mid-gap electrode 720 has a beveled corner 726 or shape tailored to reduce aberrant focusing.

Referring now to FIG. 8, an exemplary methodology 800 is illustrated for accelerating/decelerating ions of an ion beam in accordance with one or more aspects of the present invention. Such acceleration/deceleration may be suitable, for example, for use in selectively implanting the ions into a workpiece or wafer during semiconductor fabrication to dope areas of the wafer. Although the methodology 300 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with one or more aspects of the present invention. In addition, not all illustrated steps may be required to implement a methodology in accordance with the present invention. Furthermore, the methodologies according to the present invention may be implemented in association with the formation and/or processing of structures illustrated and described herein as well as in association with other structures not illustrated.

The methodology begins at 802 wherein a potential is developed between a first pair of electrodes to accelerate/decelerate ions of an ion beam. It will be appreciated that ions of the ion beam may also be focused by this accelerating/decelerating potential. At 804, a potential is then developed between a second pair of electrodes to deflect ions of the ion beam. At 806, a potential is developed between a third pair of electrodes downstream from the first and second electrode pairs to suppress the potentials from the first and second pairs of electrodes from extending out into a neutral zone. The methodology then ends.

It will be appreciated that the ion beam may include neutral particles which are not affected by the developed potentials. Accordingly, the neutral particles are separated out from the ions of the ion beam as the neutral particles are not deflected away from an original path of the ion beam, nor are they focused or accelerated/decelerated by the potentials. It will be further appreciated that the ion beam may travel though a gap defined between first and second apertures formed within first and second electrodes, respectively, that form the first pair of electrodes, and that the second pair of electrodes may include a first electrode located between the first pair of electrodes and above the gap and a second electrode also located between the first pair of electrodes but below the gap. This arrangement makes the electrode configuration compact, minimizing the distance the beam has to travel and thereby mitigating beam blow up.

Although the invention has been illustrated and described above with respect to a certain aspects and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the invention. In this regard, it will also be recognized that the invention may include a computer-readable medium having computer-executable instructions for performing the steps of the various methods of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", "with" and variants thereof are used in either the detailed description or the claims, these terms are intended to be inclusive in a manner similar to the term "comprising". Also, the term "exemplary" as utilized herein simply means example, rather than finest performer.

What is claimed is:

1. An acceleration structure suitable for use in implanting ions into a workpiece comprising:

a first electrode having a first aperture formed therein;

a second electrode having a second aperture formed therein, the first and second electrodes substantially parallel to one another and the first and second apertures aligned such that an axis substantially normal to the first and second electrodes passes through a gap defined between the first and second apertures and through the first and second apertures, wherein a potential developed between the first and second electrodes causes ions of an ion beam generally traveling along the axis to be accelerated or decelerated and converge depending upon biasing of the potential as an ion beam passes into the first aperture and out through the second aperture;

a first mid-gap electrode located between the first and second electrodes and above the axis; and a second mid-gap electrode located between the first and second electrodes and below the axis, wherein a potential developed between the first and second mid-gap electrodes causes the ions within the ion beam to deflect away from the axis, wherein the first and second mid-gap electrodes have different widths and at least one of the first and second mid-gap electrodes have a non-planar surface facing the ion beam to facilitate control over the convergence of the ion beam, and wherein the acceleration structure is situated between an output of a mass analyzing beamline assembly and an input of an end station in an ion implantation system.

2. The acceleration structure of claim 1, the first and second mid-gap electrodes substantially parallel to one another.

3. The acceleration structure of claim 1, the non-planar surface comprising at least one of the mid-gap electrodes having a beveled corner.

4. The acceleration structure of claim 1, the ion beam further comprising electrically neutral particles, the potential developed between the first and second mid-gap electrodes not affecting the electrically neutral particles such that the electrically neutral particles pass through the gap and continue on in a direction substantially parallel to the axis and are thereby separated out from the deflected ion beam.

5. The acceleration structure of claim 4, the electrically neutral particles not being affected by the potential developed between the first and second electrodes such that the electrically neutral particles are neither accelerated nor decelerated by the accelerator.

6. The acceleration structure of claim 5, the electrically neutral particles not converging and continuing on in a direction substantially parallel to the axis so as to be separated out from the deflected converged ion beam.

7. The acceleration structure of claim 6, further comprising:

a first suppression electrode located downstream of the first mid-gap electrode and above the gap; and a second suppression electrode located downstream of the second mid-gap electrode and below the gap, wherein a potential developed between the first and second suppression electrodes establishes a barrier preventing potentials within the gap from extending out into a neutral zone downstream of the accelerator.

8. The acceleration structure of claim 7, further comprising:

a third electrode having a third aperture formed therein, the third electrode substantially parallel to the first and second electrodes, and the third aperture aligned with the first and second apertures such that the axis passes through coincident points in the first, second and third apertures, wherein a potential applied to the third electrode serves to terminate the barrier established by the suppression electrodes.

9. An acceleration structure suitable for use in implanting ions into a workpiece comprising:

means for focusing and accelerating/decelerating ions of an ion beam; and means for bending the ion beam by deflecting ions within the ion beam away from an axis along which the ion beam generally travels, wherein the means for accelerating/decelerating and the means for bending operate independently of one another to accelerate/decelerate and bend the beam, respectively, wherein the means for bending includes a non-planar surface facing the ion beam to regulate focusing of the ion beam, and wherein the acceleration structure is situated between an output of a mass analyzing beamline assembly and an input of an end station in an ion implantation system.

10. The acceleration structure of claim 9, the ion beam further comprising neutral particles, the neutral particles not affected by the means for accelerating/decelerating nor the means for bending such that the neutral particles continue generally traveling along the axis and are thereby separated out from the ions within the ion beam.

11. The acceleration structure of claim 9, the means for bending located between components of the means for accelerating/decelerating.

12. The acceleration structure of claim 9, wherein the non-planar surface includes a beveled corner.

* * * * *